(12) United States Patent
Han et al.

(10) Patent No.: US 9,173,291 B2
(45) Date of Patent: Oct. 27, 2015

(54) CIRCUIT BOARD AND METHOD FOR MANUFACTURING THE SAME

(71) Applicant: Samsung Electro-Mechanics Co., Ltd., Suwon (KR)

(72) Inventors: Sung Han, Suwon (KR); Young Do Kweon, Suwon (KR); Jin Gu Kim, Suwon (KR); Hyung Jin Jeon, Suwon (KR); Yoon Su Kim, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 4 days.

(21) Appl. No.: 14/060,345

(22) Filed: Oct. 22, 2013

(65) Prior Publication Data

US 2014/0182915 A1  Jul. 3, 2014

(30) Foreign Application Priority Data

Dec. 28, 2012 (KR) .................. 10-2012-0157167

(51) Int. Cl.
*H05K 1/11* (2006.01)
*H05K 3/00* (2006.01)
*H05K 3/42* (2006.01)

(52) U.S. Cl.
CPC ............ *H05K 1/116* (2013.01); *H05K 1/113* (2013.01); *H05K 3/0017* (2013.01); *H05K 3/421* (2013.01); *H05K 3/002* (2013.01); *H05K 2201/0195* (2013.01); *H05K 2201/09563* (2013.01); *H05K 2201/09854* (2013.01); *H05K 2203/0733* (2013.01)

(58) Field of Classification Search
CPC ..... H05K 1/116; H05K 1/113; H05K 3/0017; H05K 3/002
See application file for complete search history.

(56) References Cited

U.S. PATENT DOCUMENTS

2003/0213980 A1* 11/2003 Tanaka et al. ................. 257/200
2013/0020719 A1*  1/2013 Jung et al. ..................... 257/774

FOREIGN PATENT DOCUMENTS

JP    2001-313336    11/2001
JP    2005-268312     9/2005

* cited by examiner

*Primary Examiner* — Jeremy C Norris
(74) *Attorney, Agent, or Firm* — NSIP Law

(57) ABSTRACT

The present invention relates to a circuit board. A circuit board in accordance with an embodiment of the present invention includes a base substrate; an interlayer insulating layer covering the base substrate; a via structure passing through at least the interlayer insulating layer of the base substrate and the interlayer insulating layer in the vertical direction; and an etch stop pattern disposed on the interlayer insulating layer in the horizontal direction to surround the via structure and made of an insulating material.

31 Claims, 9 Drawing Sheets

(12) United States Patent

CIRCUIT BOARD AND METHOD FOR MANUFACTURING THE SAME

CROSS-REFERENCE TO RELATED APPLICATIONS

This application claims the foreign priority benefit under 35 U.S.C. Section 119 of Korean Patent Application Serial No. 10-2012-0157167, filed Dec. 28, 2012, which is hereby incorporated by reference in its entirety into this application.

BACKGROUND OF THE INVENTION

1. Field of the Invention

The present invention relates to a circuit board and a method for manufacturing the same, and more particularly, to a circuit board with a via structure which has a vertically perpendicular side surface and can implement a fine pitch, and a method for manufacturing the same.

2. Description of the Related Art

As the miniaturization and thinning of electronic components progress, there is also an increasing demand for miniaturization and thinning of package substrates and printed circuit boards, and there is also a demand for high fine pitch of metal vias such as a normal via, a blind via, and a buried via which are applied to these electronic substrates.

The levels of fine pitch required for a via structure applied to the recent package substrates and printed circuit boards are that the width of a via pad is less than 15 µm, the width of a via is less than 5 µm, and the interval between the vias is less than 30 µm. However, since the conventional vias are usually formed to have an inclined side surface, there are limitations in reducing the interval between the vias. Further, when the thickness of a resist layer used as an interlayer insulating layer is large, the conventional via forming techniques have difficulty in implementing an integrated via structure due to difficulty in forming a precise via hole. Particularly, when the thickness of the resist layer is greater than 2 µm, further greater than 10 µm, since it reaches the limits of resolution of a photolithography process, there is a demand for techniques that can form an integrated via structure regardless of the thickness of a resist layer.

RELATED ART DOCUMENT

Patent Document

Patent Document 1: Japanese Patent Laid-open Publication No. JP 2001-313336

SUMMARY OF THE INVENTION

The present invention has been invented in order to overcome the above-described problems and it is, therefore, an object of the present invention to provide a circuit board with a fine-pitch via structure.

It is another object of the present invention to provide a circuit board with a via structure having a vertically perpendicular side surface inside a relatively thick interlayer insulating layer.

It is another object of the present invention to provide a method for manufacturing a circuit board that can implement a fine-pitch via structure.

It is another object of the present invention to provide a method for manufacturing a circuit board that can form a via structure having a vertically perpendicular side surface inside a relatively thick interlayer insulating layer.

In accordance with an embodiment of the present invention to achieve the object, there is provided a circuit board including: a base substrate; an interlayer insulating layer covering the base substrate; a via structure passing through at least the interlayer insulating layer of the base substrate and the interlayer insulating layer in the vertical direction; and an etch stop pattern disposed on the interlayer insulating layer in the horizontal direction perpendicular to the vertical direction to surround the via structure and made of an insulating material.

In accordance with an embodiment of the present invention, the etch stop pattern may have a lower etch rate than the interlayer insulating layer.

In accordance with an embodiment of the present invention, the via structure may include a through via passing through both of the base substrate and the interlayer insulating layer.

In accordance with an embodiment of the present invention, the via structure may include a buried via passing through only the interlayer insulating layer.

In accordance with an embodiment of the present invention, the via structure may include a via body passing through the interlayer insulating layer and a via pad connected to the via body on the interlayer insulating layer, wherein the via body and the via pad may be integrally formed by a single plating process.

In accordance with an embodiment of the present invention, the interlayer insulating layer may include a first insulating layer covering the base substrate to surround a lower portion of the via structure and a second insulating layer covering the first insulating layer to surround an upper portion of the via structure, and the etch stop pattern may be interposed between the first insulating layer and the second insulating layer.

In accordance with an embodiment of the present invention, the interlayer insulating layer may include a first insulating layer covering the base substrate to surround a lower portion of the via structure and a second insulating layer covering the first insulating layer to surround an upper portion of the via structure, and the etch stop pattern may include a first etch stop pattern interposed between the first insulating layer and the second insulating layer and a second etch stop pattern disposed on the second insulating layer and having an upper surface coplanar with an upper surface of the via structure.

In accordance with an embodiment of the present invention, the interlayer insulating layer may include a first insulating layer covering the base substrate to surround a lower portion of the via structure and a second insulating layer covering the first insulating layer to surround an upper portion of the via structure, the etch stop pattern may include a first etch stop pattern interposed between the first insulating layer and the second insulating layer, and the via structure may project higher than an upper surface of the second insulating layer.

In accordance with an embodiment of the present invention, the interlayer insulating layer may include a first insulating layer covering the base substrate to surround a lower portion of the via structure and a second insulating layer covering the first insulating layer to surround an upper portion of the via structure, and the first insulating layer and the second insulating layer may be made of different photosensitive insulating materials.

In accordance with an embodiment of the present invention, the interlayer insulating layer may include a first insulating layer covering the base substrate to surround a lower portion of the via structure and a second insulating layer covering the first insulating layer to surround an upper portion of the via structure, and the first insulating layer and the second insulating layer may be made of the same insulating material.

In accordance with an embodiment of the present invention, the interlayer insulating layer may have a thickness of greater than 2 μm, and the via structure may have a vertically perpendicular side surface.

In accordance with an embodiment of the present invention to achieve the object, there is provided a method for manufacturing a circuit board, including the steps of: preparing a base substrate; forming a first insulating layer on the base substrate; forming an etch stop pattern on the first insulating layer with an insulating material; forming a second insulating layer on the etch stop pattern; performing an etching process for removing the second insulating layer and the first insulating layer by using the etch stop pattern as an etch stop layer to expose the base substrate; and performing a plating process by using the second insulating layer as a plating resist.

In accordance with an embodiment of the present invention, the step of forming the etch stop pattern may include the step of coating a material having a lower etch rate than the first insulating layer and the second insulating layer on the first insulating layer.

In accordance with an embodiment of the present invention, the step of performing the etching process may include the step of performing a reactive ion etching (RIE) process.

In accordance with an embodiment of the present invention, the step of forming the second insulating layer may include the step of forming a photosensitive layer having different photosensitive properties from the first insulating layer on the etch stop pattern.

In accordance with an embodiment of the present invention, the step of forming the second insulating layer may include the step of forming an insulating layer equal to the first insulating layer on the etch stop pattern.

In accordance with an embodiment of the present invention, the method for manufacturing a circuit board may further include the step of performing a polishing process by using the second insulating layer as a polishing stop layer after the plating process.

In accordance with another embodiment of the present invention to achieve the object, there is provided a circuit board including: a base substrate; an interlayer insulating layer covering the base substrate; a via structure passing through at least the interlayer insulating layer of the base substrate and the interlayer insulating layer in the vertical direction; and an etch stop pattern disposed inside the interlayer insulating layer in the horizontal direction perpendicular to the vertical direction to have a ring shape surrounding a side surface of the via structure and made of a conductive material.

In accordance with another embodiment of the present invention, the etch stop pattern may have a lower etch rate than the interlayer insulating layer.

In accordance with another embodiment of the present invention, the via structure may include a through via passing through both of the base substrate and the interlayer insulating layer.

In accordance with another embodiment of the present invention, the via structure may include a buried via passing through only the interlayer insulating layer.

In accordance with another embodiment of the present invention, the via structure may include a via body passing through the interlayer insulating layer and a via pad connected to the via body on the interlayer insulating layer, wherein the via body and the via pad may be integrally formed by a single plating process.

In accordance with another embodiment of the present invention, the interlayer insulating layer may include a first insulating layer covering the base substrate to surround a lower portion of the via structure and a second insulating layer covering the first insulating layer to surround an upper portion of the via structure, and the etch stop pattern may be interposed between the first insulating layer and the second insulating layer.

In accordance with another embodiment of the present invention, the interlayer insulating layer may include a first insulating layer covering the base substrate to surround a lower portion of the via structure and a second insulating layer covering the first insulating layer to surround an upper portion of the via structure, the etch stop pattern may be interposed between the first insulating layer and the second insulating layer, and the via structure may project higher than an upper surface of the second insulating layer.

In accordance with another embodiment of the present invention, the interlayer insulating layer may include a first insulating layer covering the base substrate to surround a lower portion of the via structure and a second insulating layer covering the first insulating layer to surround an upper portion of the via structure, and the first insulating layer and the second insulating layer may be made of different photosensitive insulating materials.

In accordance with another embodiment of the present invention, the interlayer insulating layer may include a first insulating layer covering the base substrate to surround a lower portion of the via structure and a second insulating layer covering the first insulating layer to surround an upper portion of the via structure, and the first insulating layer and the second insulating layer may be made of the same insulating material.

In accordance with another embodiment of the present invention, the interlayer insulating layer may have a thickness of greater than 2 μm, and the via structure may have a vertically perpendicular side surface.

In accordance with another embodiment of the present invention to achieve the object, there is provided a method for manufacturing a circuit board, including the steps of: preparing a base substrate; forming a first insulating layer on the base substrate; forming a ring-shaped etch stop pattern on the first insulating layer with a conductive material; forming a second insulating layer on the etch stop pattern; forming a porous plate-shaped etch stop pattern on the second insulating layer with a conductive material; performing an etching process for removing the second insulating layer and the first insulating layer by using the ring- and plate-shaped etch stop patterns as etch stop layers to expose the base substrate; performing a plating process by using the second insulating layer as a plating resist; and removing the plate-shaped etch stop pattern.

In accordance with another embodiment of the present invention, the step of forming the etch stop pattern may include the step of coating a material having a lower etch rate than the first insulating layer and the second insulating layer on the first insulating layer.

In accordance with another embodiment of the present invention, the step of performing the etching process may include the step of performing a reactive ion etching (RIE) process.

In accordance with another embodiment of the present invention, the step of forming the second insulating layer may include the step of forming a photosensitive layer different from the first insulating layer on the ring-shaped etch stop pattern.

In accordance with another embodiment of the present invention, the step of forming the second insulating layer may include the step of forming an insulating layer equal to the first insulating layer on the ring-shaped etch stop pattern.

In accordance with another embodiment of the present invention, the method for manufacturing a circuit board may further include the step of performing a polishing process by using the plate-shaped etch stop pattern as a polishing stop layer after the plating process.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
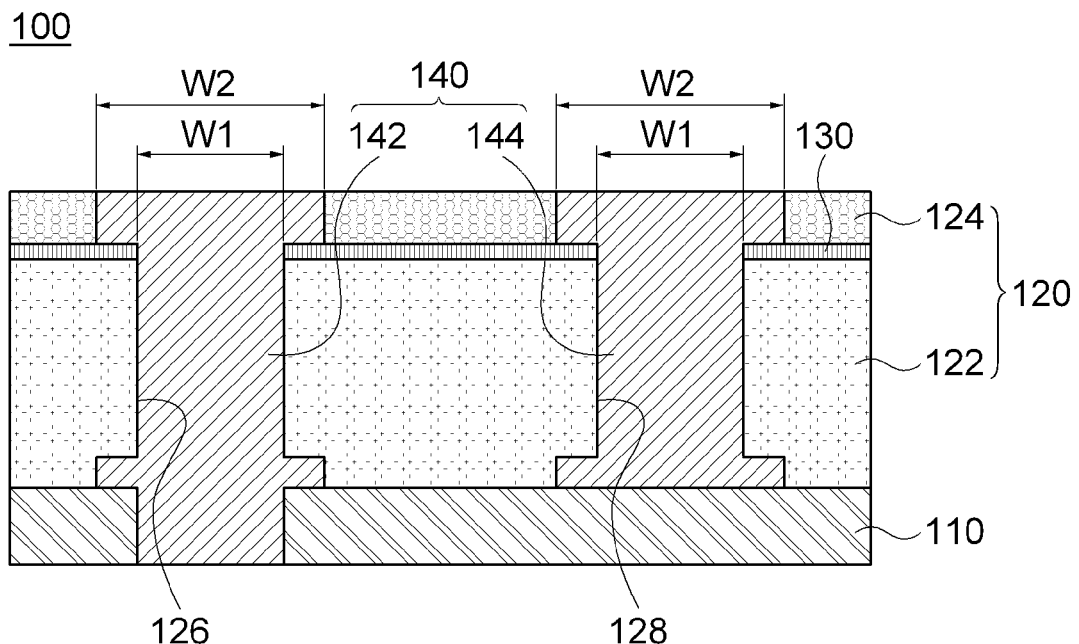
FIG. 1 is a view showing a circuit board in accordance with an embodiment of the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Further, embodiments to be described throughout the specification will be described with reference to cross-sectional views and/or plan views, which are ideal exemplary drawings of the present invention. In the drawings, the thicknesses of layers and regions may be exaggerated for the effective explanation of technical contents. Therefore, the exemplary drawings may be modified by manufacturing techniques and/or tolerances. Therefore, the embodiments of the present invention are not limited to the accompanying drawings, and can include modifications to be generated according to manufacturing processes. For example, a region shown at a right angle may be formed in the rounded shape or formed to have a predetermined curvature.

Hereinafter, circuit boards and methods for manufacturing the same in accordance with embodiments of the present invention will be described in detail with reference to the accompanying drawings.

FIG. 1 is a view showing a circuit board in accordance with an embodiment of the present invention. Referring to FIG. 1, a circuit board 100 in accordance with an embodiment of the present invention may include a base substrate 110, an interlayer insulating layer 120, an etch stop pattern 130, and a via structure 140.

The base substrate 110 may be a plate for manufacture of the components 120, 130, and 140 of the circuit board 100. As an example, the base substrate 110 may be a core substrate formed by processing a copper clad laminate (CCL). As another example, the base substrate 110 may be an insulation film called a green sheet.

The interlayer insulating layer 120 may have multilayered insulating layers. For example, the interlayer insulating layer 120 may have a first insulating layer 122 and a second insulating layer 124 which are sequentially laminated on the base substrate 110. The first insulating layer 122 may be a photosensitive insulating layer. The first insulating layer 122 may be a photoresist layer. The second insulating layer 124 may be an insulating layer different from the first insulating layer 122. As an example, the second insulating layer 124 may be a photoresist layer having different photosensitive properties from the first insulating layer 122. As another example, the second insulating layer 124 may be an insulating layer such as an oxide layer or a nitride layer which doesn't have photosensitivity. The materials of the first and second insulating layers 122 and 124 may be changed variously and may not be limited to the above examples.

Since the interlayer insulating layer 120 has a multilayer structure, it may have a relatively larger thickness than a typical interlayer insulating layer. For example, the interlayer insulating layer 120 may have a structure in which the first and second insulating layers 122 and 124 are laminated vertically and thus may have a thickness of greater than about 2 μm, further greater than 10 μm. The interlayer insulating layer 120 having this structure may be provided to satisfy a circuit board requiring a via structure having a vertical height of greater than 2 μm, further greater than 10 μm.

First and second via holes 126 and 128 may be formed in the first and second insulating layers 122 and 124 to define a space in which the via structure 140 is to be formed. The first via hole 126 may be a hole passing through both of the base substrate 110 and the interlayer insulating layer 120, and the second via hole 128 may be a hole passing through only the interlayer insulating layer 120. The first and second via holes 126 and 128 may vertically pass through the first and second insulating layers 122 and 124 to have a generally perpendicular side surface. Here, each of the first and second via holes 126 and 128 may have a structure in which an upper width (hereinafter, referred to as 'second opening width' W2) defined by the second insulating layer 124 is larger than a lower width (hereinafter, referred to as 'first opening width' W1) defined by the first insulating layer 122.

The etch stop pattern 130 may be disposed inside the interlayer insulating layer 120 to cross the interlayer insulating layer 120 in the horizontal direction. For example, the etch stop pattern 130 may be disposed between the first insulating layer 122 and the second insulating layer 124. An opening for defining the first opening width W1 may be formed in the etch stop pattern 130 in the process of forming the first and second via holes 126 and 128. Further, the etch stop pattern 130 may be formed of a material having a different etch selectivity from the interlayer insulating layer 120. As an example, the etch stop pattern 130 may be formed of an insulating material having a remarkably lower etch rate than the interlayer insulating layer 120.

The via structure 140 may have a through via 142 and a buried via 144. The through via 142 may have a structure passing through both of the base substrate 110 and the interlayer insulating layer 120, and the buried via 144 may have a structure passing through only the interlayer insulating layer 120. For this, the through via 142 may be filled in the first via hole 126, and the buried via 144 may be filled in the second via hole 128.

Meanwhile, the via structure 140 may be formed by filling a plating layer in the first and second via holes 126 and 128 through a single plating process. Since the first and second via holes 126 and 128 have a vertically perpendicular side surface, the through via 142 and the buried via 144 also can have a vertically perpendicular side surface structure. Further, as described above, since the second opening width W2 is larger than the first opening width W1, an upper portion of the via structure 140, which is surrounded by the second insulating layer 124, may have a larger width than a lower portion of the via structure 140, which is surrounded by the first insulating layer 122. In this case, the lower portion of the via structure 140 may be used as a via body, and the upper portion thereof may be used as a via pad. When the via structure 140 is formed by a single plating process, the via pad and the via body may be integrally formed of the same material.

As described above, the circuit board in accordance with an embodiment of the present invention may include the base substrate 110, the interlayer insulating layer 120 formed on the base substrate 110 and having a multilayer structure and a relatively large thickness, and the via structure 140 passing through at least the interlayer insulating layer 120 of the base substrate 110 and the interlayer insulating layer 120, wherein the via structure 140 may have a vertically perpendicular side surface. Accordingly, since the circuit board in accordance with the present invention has a structure in which a via structure, which vertically passes through a base substrate and an interlayer insulating layer having a large thickness, has a vertically perpendicular side surface, it is possible to have a fine-pitch via structure by reducing the interval between the via structures. Particularly, even when the thickness of the interlayer insulating layer is greater than 2 μm, further greater than 10 μm, it is possible to reduce the interval between the vertically perpendicular via structures to less than 30 μm.

Further, as described above, the circuit board 100 in accordance with an embodiment of the present invention may include the base substrate 110, the interlayer insulating layer 120 laminated on the base substrate 110, and the via structure 140 passing through at least the interlayer insulating layer 120 of the base substrate 110 and the interlayer insulating layer 120. Since the upper portion of the via structure 140 has a larger width than the lower portion thereof, the upper portion of the via structure 140 may be used as a via pad for electrical connection with a circuit pattern or a connection terminal of another layer of the via structure 140. In this case, the via structure 140 may have a structure in which the via body for interlayer conduction and the via pad for connecting the via body to the other side circuit are integrally formed.

Accordingly, since the circuit board in accordance with the present invention can integrally form a via body and a via pad for connecting the via body to the other side circuit in a via structure for interlayer conduction, it is possible to improve bonding reliability of the via and efficiency of manufacturing processes of the via compared to a via structure of which a via body and a via pad (or via land) are manufactured by separate processes.

Continuously, a method for manufacturing a circuit board in accordance with an embodiment of the present invention will be described in detail. Here, descriptions overlapping with those of the circuit board 100 described above will be omitted or simplified.

Figure 2:
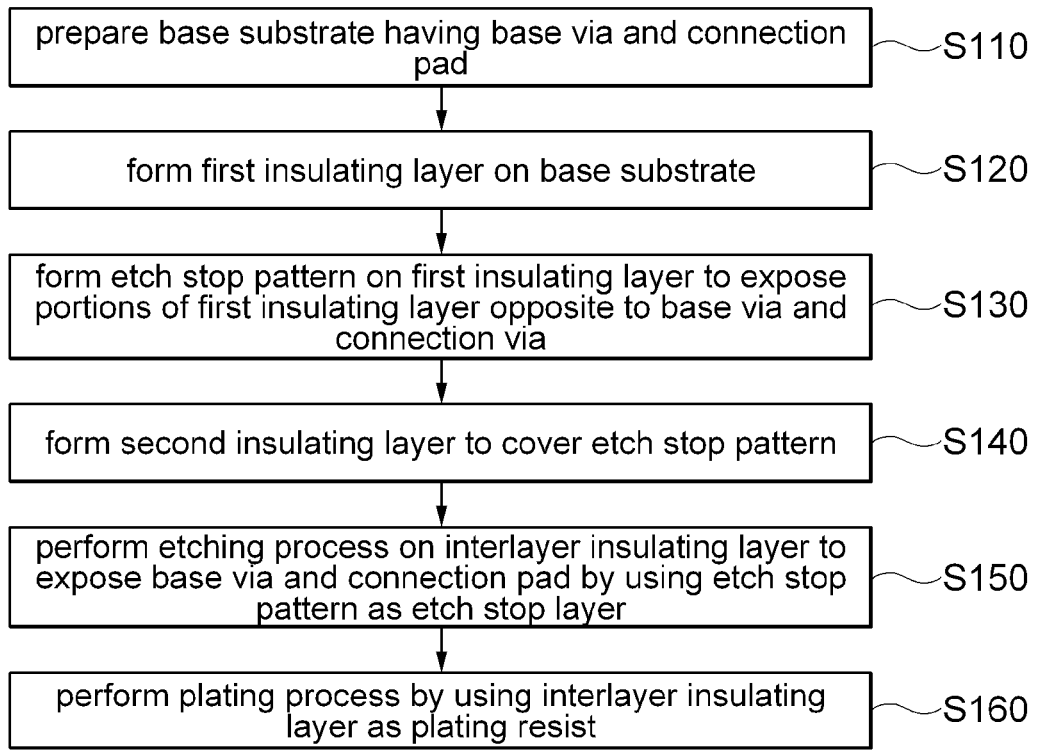
FIG. 2 is a flowchart showing a method for manufacturing a circuit board in accordance with an embodiment of the present invention.

FIG. 2 is a flowchart showing a method for manufacturing a circuit board in accordance with an embodiment of the present invention, and FIGS. 3a to 3e are views for explaining a process of manufacturing a circuit board in accordance with an embodiment of the present invention.

Figure 3A:
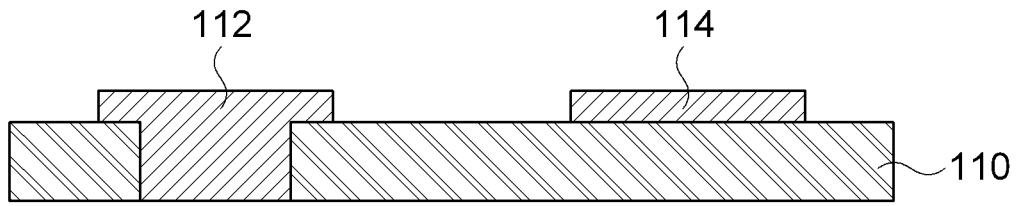
FIGS. 3a to 3e are views for explaining a process of manufacturing a circuit board in accordance with an embodiment of the present invention.

Referring to FIGS. 2 and 3a, a base substrate 100 having a base via 112 and a connection pad 114 is prepared (S110). As an example, the step of preparing the base substrate 110 may be performed by forming a via hole in a copper clad laminate, forming a plating layer on the copper clad laminate, and patterning the plating layer. As another example, the step of preparing the base substrate 110 may be performed by forming a via hole in a predetermined insulation sheet and performing a plating process. Here, the base via 112 may be a column-shaped interlayer conducting via which passes through the base substrate 110, and the connection pad 114 may be a plate-shaped metal pad which covers one surface of the base substrate 110.

Figure 3B:
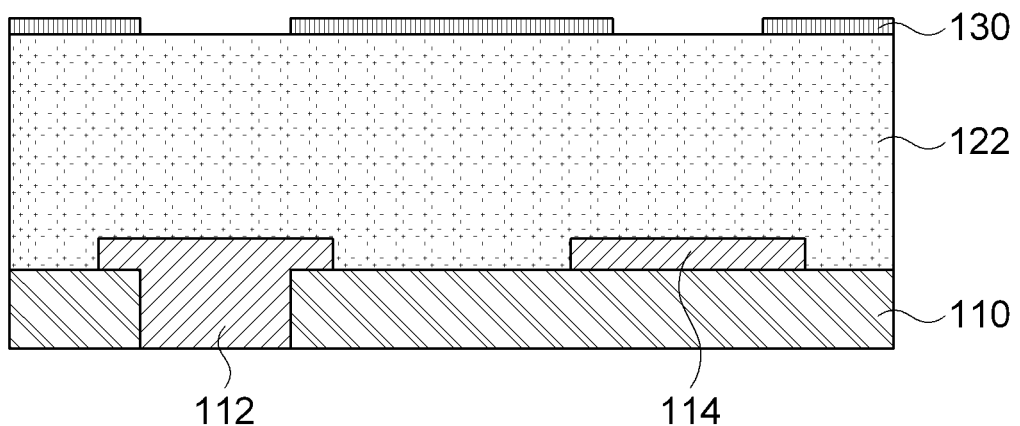

Referring to FIGS. 2 and 3b, a first insulating layer 122 is formed on the base substrate 110 (S120). The step of forming the first insulating layer 122 may be performed by forming a coating layer on the base substrate 110 with a photosensitive insulating material and curing the coating layer. As another example, the formation of the first insulating layer 122 may be performed by forming an insulating layer such as an oxide layer or a nitride layer, not a photosensitive insulating layer.

An etch stop pattern 130 is formed on the first insulating layer 122 to expose portions of the first insulating layer 122 which are opposite to the base via 112 and the connection pad 114 (S130). The formation of the etch stop pattern 130 may be performed by forming an insulating pattern, which may have a different etch selectivity from the first insulating layer 122, in the subsequent etching process of the first insulating layer 120.

Figure 3C:
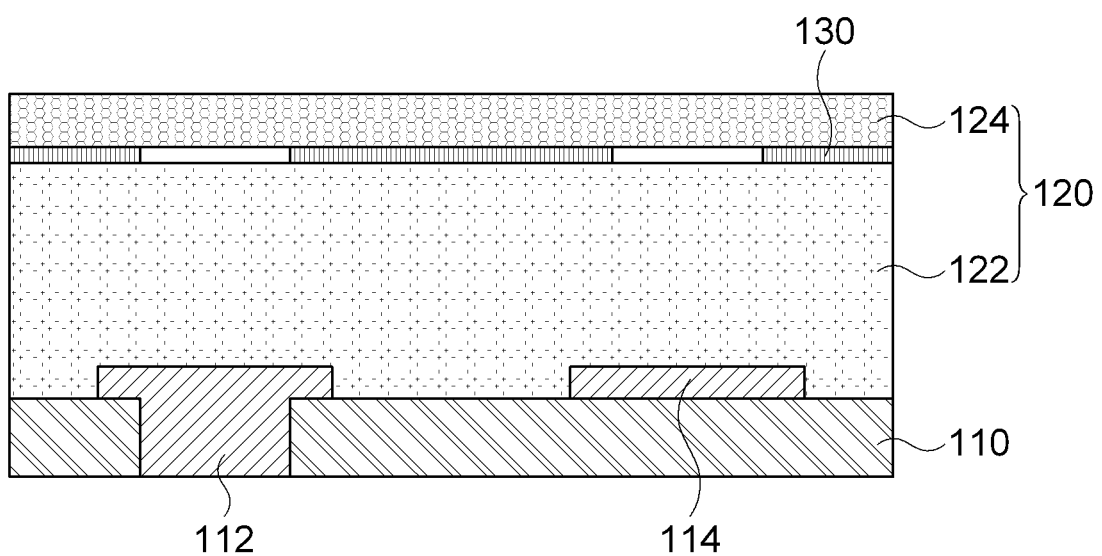

Referring to FIGS. 2 and 3c, a second insulating layer 124 is formed to cover the etch stop pattern 130 (S140). For example, the step of forming the second insulating layer 124 may be performed by forming a photosensitive resist layer on the first insulating layer 122 having the etch stop pattern 130 thereon and curing the photosensitive resist layer. Here, the second insulating layer 124 may have a lower etch rate than the first insulating layer 122. In this case, it is possible to give an etch selectivity to a region of a second opening width W2 in the etching process described below by performing exposure and developing processes on the photosensitive resist layer. Accordingly, an interlayer insulating layer 120, which consists of the first insulating layer 122 and the second insulating layer 124 sequentially laminated on the substrate 110, can be formed on the substrate 110, and the etch stop pattern 130 can be provided inside the interlayer insulating layer 120 to cross the interlayer insulating layer 120 in the horizontal direction.

Figure 3D:
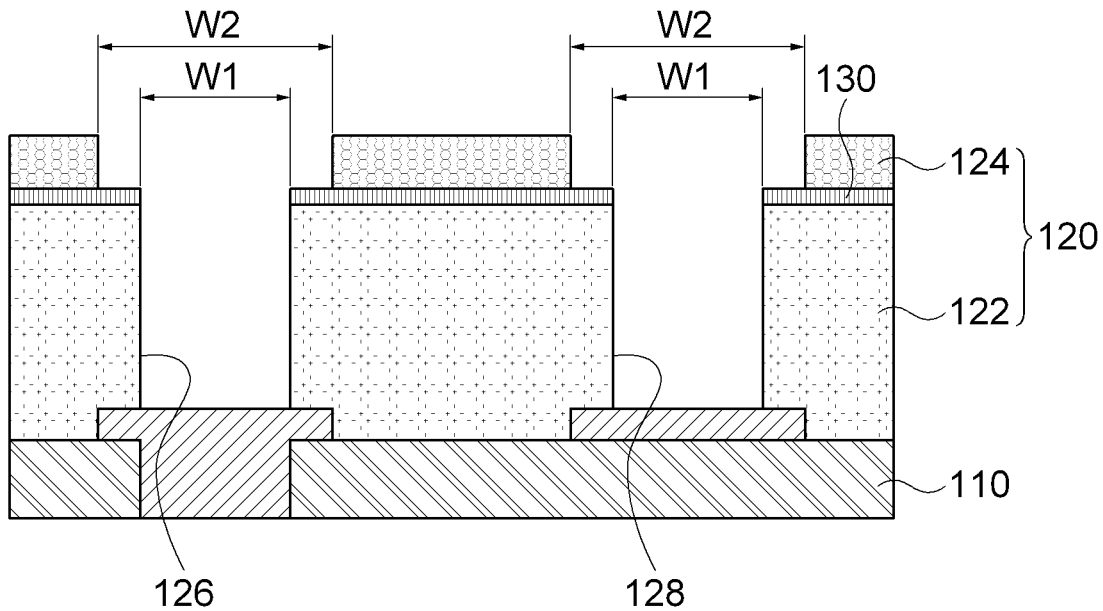

Referring to FIGS. 2 and 3d, an etching process is performed on the interlayer insulating layer 120 to expose the base via 112 and the connection pad 114 by using the etch stop pattern 130 as an etch stop layer (S150). The etching process may use a method that can pass through the thick interlayer insulating layer 120 having a multilayer structure consisting of the first and second insulating layers 122 and 124 by a single process. For example, a method that can pass through the interlayer insulating layer 120 having a thickness of greater than about 2 μm, further greater than 10 μm may be preferable. As an example, the etching process may be a reactive ion etching (RIE) process. The RIE process may be an anisotropic etching process or an isotropic etching process. The RIE process may etch the interlayer insulating layer 120 using ions having a directivity vertically perpendicular to the base substrate 110. Accordingly, a first through hole 126, which exposes the base via 112, and a second through hole 128, which exposes the connection pad 114, can be formed in the interlayer insulating layer 120.

Here, the first and second through holes 126 and 128 may have a vertically perpendicular side wall through the above RIE process. Further, etching conditions of the etching process may be adjusted so that an opening width (hereinafter, referred to as 'second opening width' W2) of the first and second through holes 126 and 128 in the second insulating layer 124 is larger than an opening width (hereinafter, referred to as 'first opening width' W1) of the first and second through holes 126 and 128 in the first insulating layer 122. For this, RIE ions collide with a somewhat larger region than the first opening width W1 by the RIE process so that the RIE ions etch the second insulating layer 124 with the second opening width W2 up to the etch stop pattern 130 and etch the first insulating layer 122 with the first opening width W1 from the etch stop pattern 130. That is, it is possible to form the first and second through holes 126 and 128 having the stepped side surfaces by using the second insulating layer 124 and the etch stop pattern 130 having different etch selectivity.

Figure 3E:
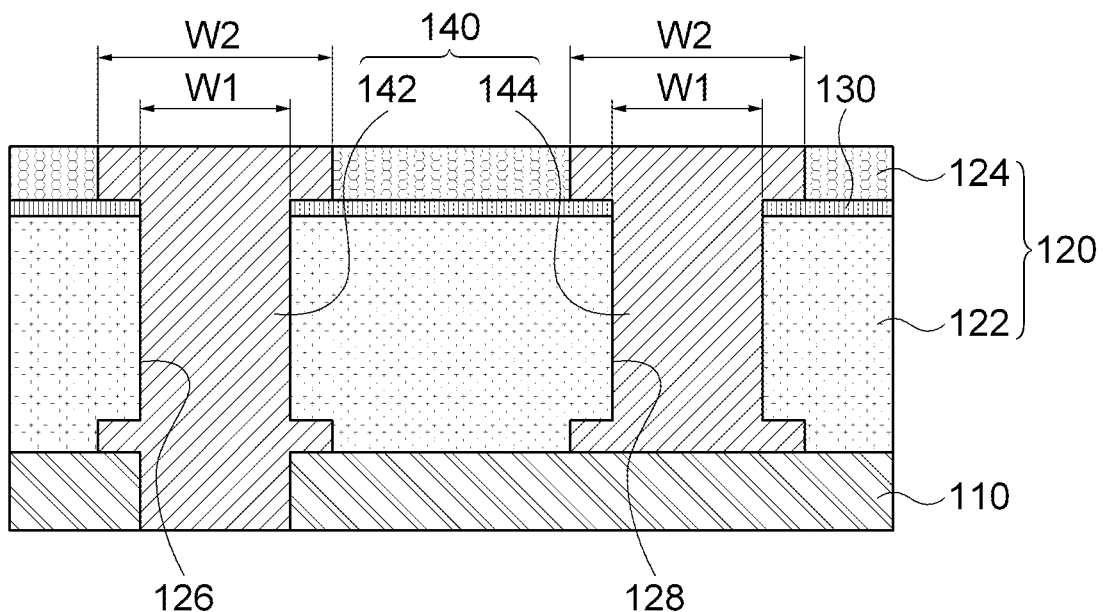

Referring to FIGS. 2 and 3e, a plating process is performed by using the interlayer insulating layer 120 as a plating resist (S160). As an example, the plating process may be an electroless plating process. As another example, the plating process may be an electroplating process using a seed layer as a seed after forming the metal seed layer on a surface of the interlayer insulating layer 120 exposed by the first and second through holes 126 and 128. Through the above plating process, it is possible to form a plating layer adhered to the base via 112 of FIG. 3d and the via pad 114 of FIG. 3d in the interlayer insulating layer 120 by filling the plating layer in the first and second through holes 126 and 128. And, the plating layer may be polished by using the interlayer insulating layer 120 as a polishing stop layer. Accordingly, a via structure 140 having a through via 142 and a buried via 144 which vertically pass the interlayer insulating layer 120 and of which upper surfaces are coplanar with an upper surface of the interlayer insulating layer 120 can be formed on the base substrate 110.

Meanwhile, as described above, since the second opening width W2 is larger than the first opening width W1, a width of an upper portion of the via structure 140 formed within the second opening width W2 may be larger than a width of a lower portion of the via structure 140 formed within the first opening width W1. In this case, the upper portion of the via structure 140 formed within the second opening width W2 may be used as a via pad of the through via 142 and the buried via 144.

As described above, the method for manufacturing a circuit board in accordance with an embodiment of the present invention may form the via structure 140, which fills the first and second through holes 126 and 128, by forming the first insulating layer 122 and the second insulating layer 124 on the base substrate 110 with the etch stop pattern 130 interposed therebetween, performing an etching process on the second insulating layer 124 and the first insulating layer 122 by using the etch stop pattern 130 as an etch stop layer, and performing a plating process. At this time, it is possible to form the via structure 140 having a vertically perpendicular side wall while passing through the interlayer insulating layer 120 having a relatively large thickness by using the RIE process having high anisotropic properties as the etching process. Accordingly, since the method for manufacturing a circuit board in accordance with an embodiment of the present invention forms a multilayered interlayer insulating layer having an etch stop pattern embedded therein and forms a via structure which passes through the interlayer insulating layer by performing an RIE process using the etch stop pattern as an etch stop layer on the interlayer insulating layer, it is possible to form a via structure having a vertically perpendicular side surface on the relatively thick interlayer insulating layer, thus forming a fine-pitch via structure. Particularly, the method for manufacturing a circuit board in accordance with an embodiment of the present invention can form a via structure having a vertically perpendicular side surface even when the thickness of the interlayer insulating layer is greater than 2 μm, compared to a conventional method that forms a via structure having an inclined side surface when the thickness of an interlayer insulating layer is greater than 2 μm.

Further, the method for manufacturing a circuit board in accordance with an embodiment of the present invention may form the via structure 140 by forming the first and second through holes 126 and 128, whose upper width (that is, the second opening width: W2) is larger than the lower width (that is, the first opening width: W1), in the interlayer insulating layer 120 and forming the plating layer on the first and second through holes 126 and 128. In this case, it is possible to form the via and the via pad at the same time through a single plating process by using the upper portion of the via structure 140 formed within the second opening width W2 as the via pad of the via structure 140 and using the lower portion of the via structure 140 formed within the first opening width W1 as the via body of the via structure 140. Accordingly, the method for manufacturing a circuit board in accordance with an embodiment of the present invention can form a via and a via pad at the same time by performing a plating process to form a via structure after forming a via hole having a larger upper width than a lower width in an interlayer insulating layer and using a plated portion formed within the upper width as the via pad of the via structure. In this case, it is possible to simplify processes and thus improve process efficiency compared to the case in which a via and a via pad are formed by separate processes.

Continuously, a modified example of the circuit board in accordance with an embodiment of the present invention will be described in detail. Here, descriptions overlapping with those of the circuit board and the method for manufacturing the same described above will be omitted or simplified.

Figure 4:
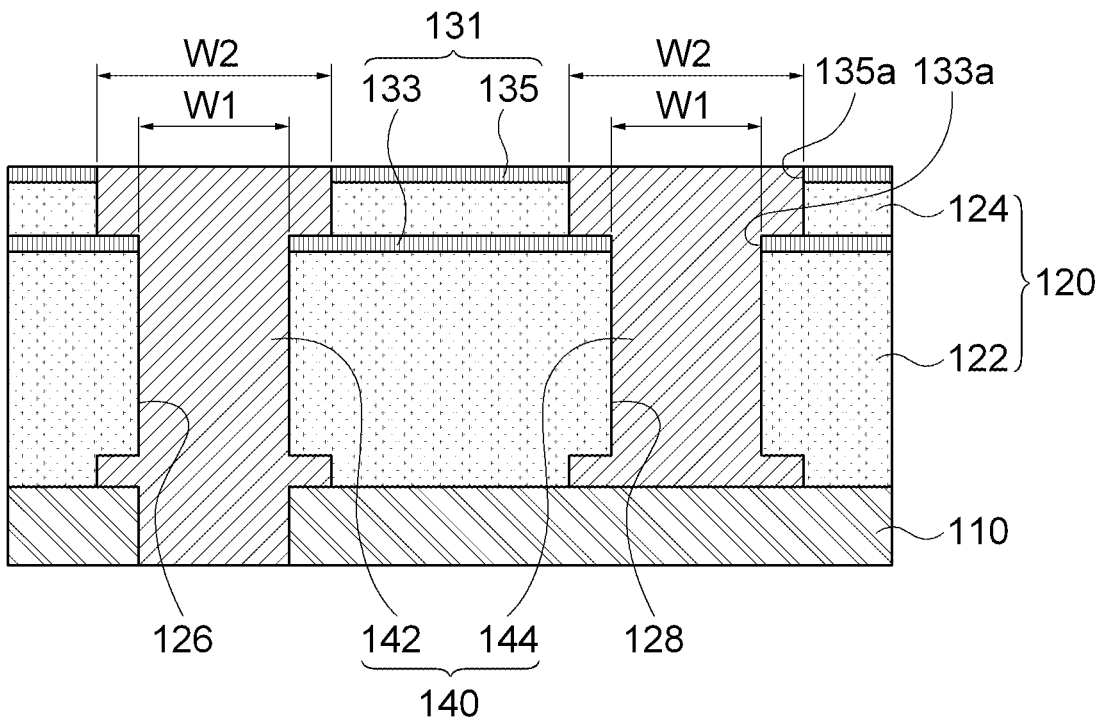
FIG. 4 is a view showing a modified example of the circuit board in accordance with an embodiment of the present invention.

FIG. 4 is a view showing a modified example of the circuit board in accordance with an embodiment of the present invention. Referring to FIG. 4, a circuit board 101 in accordance with a modified example of the present invention may include a base substrate 110, an interlayer insulating layer 120 which covers the base substrate 110, an etch stop pattern 131 provided on the interlayer insulating layer 120, and a via structure 140 which vertically passes through at least the interlayer insulating layer 120 of the base substrate 110 and the interlayer insulating layer 120.

The interlayer insulating layer 120 may have a multilayer structure consisting of a first insulating layer 122 and a second insulating layer 124 sequentially laminated on the base substrate 110. The first and second insulating layers 122 and 124 may be made of the same material. As an example, the first and second insulating layers 122 and 124 may be made of photosensitive insulating materials having the same photosensitive properties. As another example, the first and second insulating layers 122 and 124 may be made of an insulating material such as an oxide layer or a nitride layer, not a photosensitive layer.

The via structure 140 may have a through via 142, which passes through the base substrate 110 as well as the first and second insulating layers 122 and 124, and a buried via 144, which passes through the first and second insulating layers 122 and 124. The through via 142 may be formed inside a first via hole 126, which passes through the base substrate 110 and the interlayer insulating layer 120, and the buried via 144 may be formed inside a second via hole 128, which passes through the interlayer insulating layer 120.

The etch stop pattern 131 may include a first etch stop pattern 133 and a second etch stop pattern 135. The first etch stop pattern 133 may be generally equal to the etch stop pattern 130 described above with reference to FIG. 1. The second etch stop pattern 135 may be disposed on the second insulating layer 124, unlike the first etch stop pattern 133 disposed inside the interlayer insulating layer 120. Here, the second etch stop pattern 135 may be provided to surround an upper end side surface of the via structure 140. The second etch stop pattern 135 may be made of the same material as the first etch stop pattern 133.

Meanwhile, the first etch stop pattern 131 may be provided to define a lower width of the via structure 140, and the second etch stop pattern 133 may be provided to define an upper width of the via structure 140. More specifically, the first etch stop pattern 131 may have a first opening 133a for defining the lower width of the via structure 140 surrounded by the first insulating layer 122, and the second etch stop pattern 133 may have a second opening 135a for defining the upper width of the via structure 140 surrounded by the second insulating layer 122. At this time, the first and second openings 133a and 135a may be vertically opposite to each other, and the second opening 135a may have a larger width than the first opening 133a. In this case, the first and second etch stop patterns 131 and 133 may give an etch selectivity to each layer of the interlayer insulating layer 120 consisting of the first and second insulating layers 122 and 124 made of the same material in the etching process for forming the first and second via holes 126 and 128 to manufacture the via structure 140 having different widths based on the first and second etch stop patterns 131 and 135.

Continuously, a method for manufacturing a circuit board in accordance with a modified example of the present invention will be described in detail. Here, descriptions overlapping with those of the circuit board 101 in accordance with a modified example of the present invention described above will be omitted or simplified.

Figure 5:
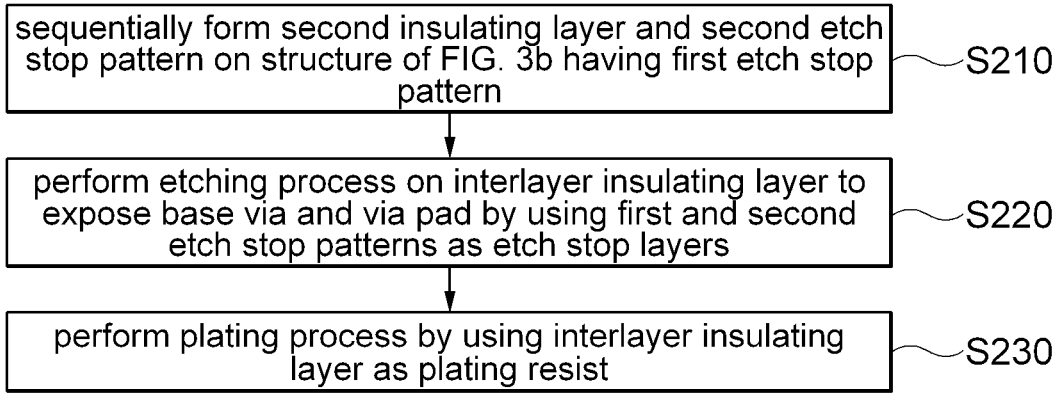
FIG. 5 is a flowchart showing a method for manufacturing the circuit board shown in FIG. 4.

FIG. 5 is a flowchart showing a method for manufacturing the circuit board shown in FIG. 4, and FIGS. 6a to 6c are views for explaining a process of manufacturing the circuit board shown in FIG. 4.

Figure 6A:
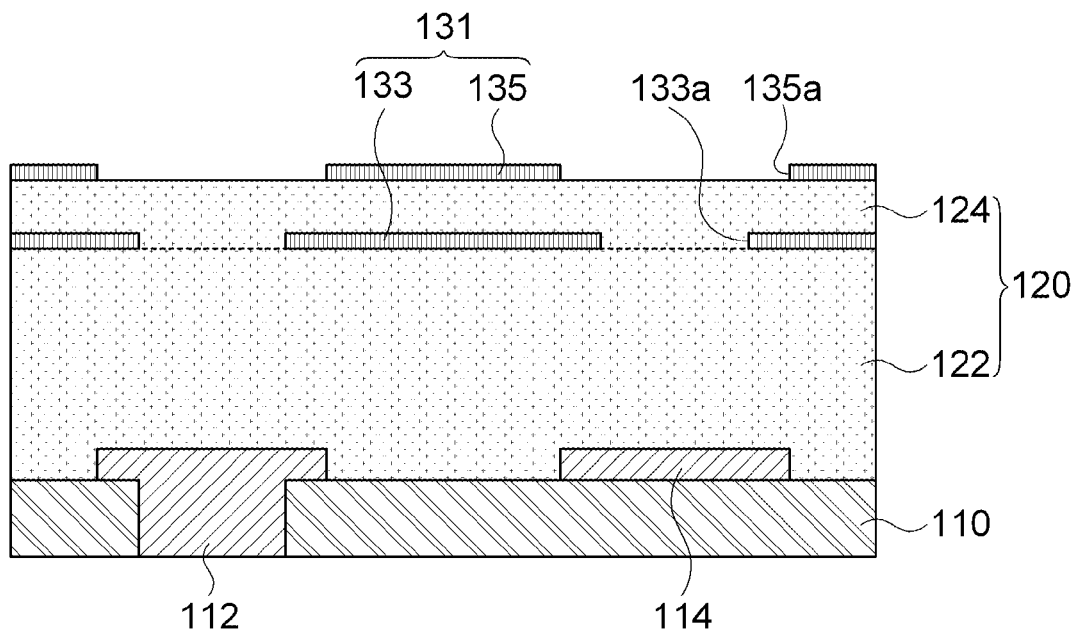
FIGS. 6a to 6c are views for explaining a process of manufacturing the circuit board shown in FIG. 4.

Referring to FIGS. 5 and 6a, a second insulating layer 124 and a second etching stop pattern 135 are sequentially formed on the structure having a first etch stop pattern 133 shown in FIG. 3b (S210). More specifically, the second insulating layer 124 and the second etch stop pattern 135 may be sequentially formed on the resultant obtained by forming the first etch stop pattern 133 on a base substrate 110 covered with a first insulating layer 122. At this time, the first etch stop pattern 133 may have a first opening 133a which exposes the first insulating layer 122 opposite to a base via 112 and a connection pad 114, and the second etch stop pattern 135 may have a second opening 135a which is opposite to the first opening 133a and has a larger width than the first opening 133a. Accordingly, an etch stop pattern 131 having the first etch stop pattern 133 formed inside an interlayer insulating layer 120 and the second etch stop pattern 135 formed on the interlayer insulating layer 120 may be formed on the base substrate 110.

Figure 6B:
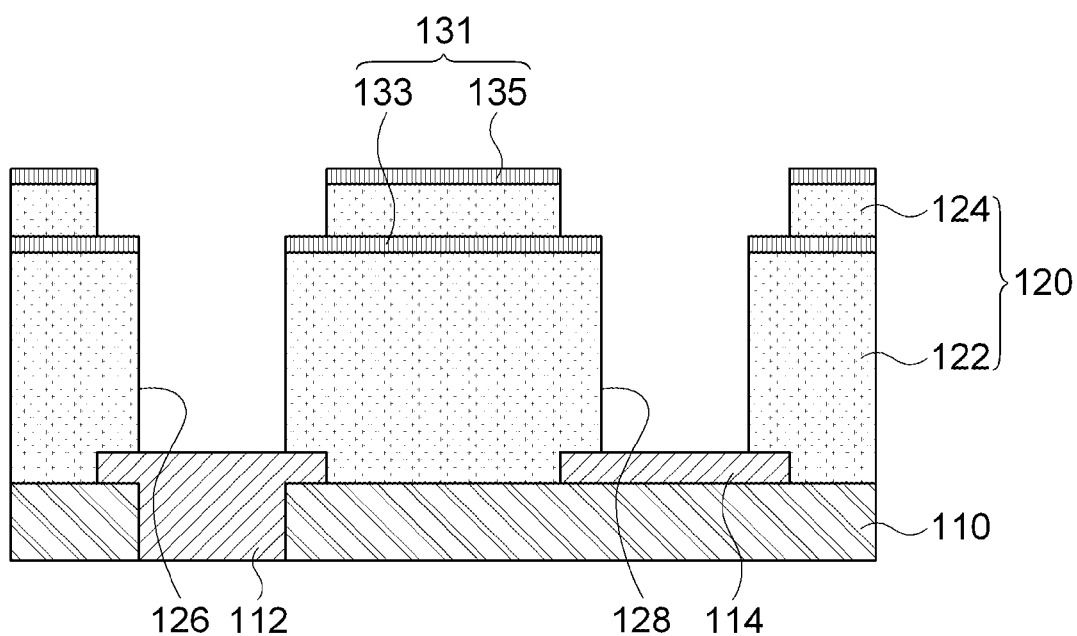

Referring to FIGS. 5 and 6b, an etching process using the etch stop pattern 131 as an etch stop layer is formed on the interlayer insulating layer 120 to expose the base via 112 and the connection pad 114 (S220). The etching process may be an RIE process. Accordingly, a first via hole 126, which exposes the base via 112, and a second via hole 128, which exposes the connection pad 114, may be formed in the interlayer insulating layer 120. At this time, the first and second via holes 126 and 128 may have a stepped side surface based on a boundary between the first and second insulating layers 122 and 124.

Figure 6C:
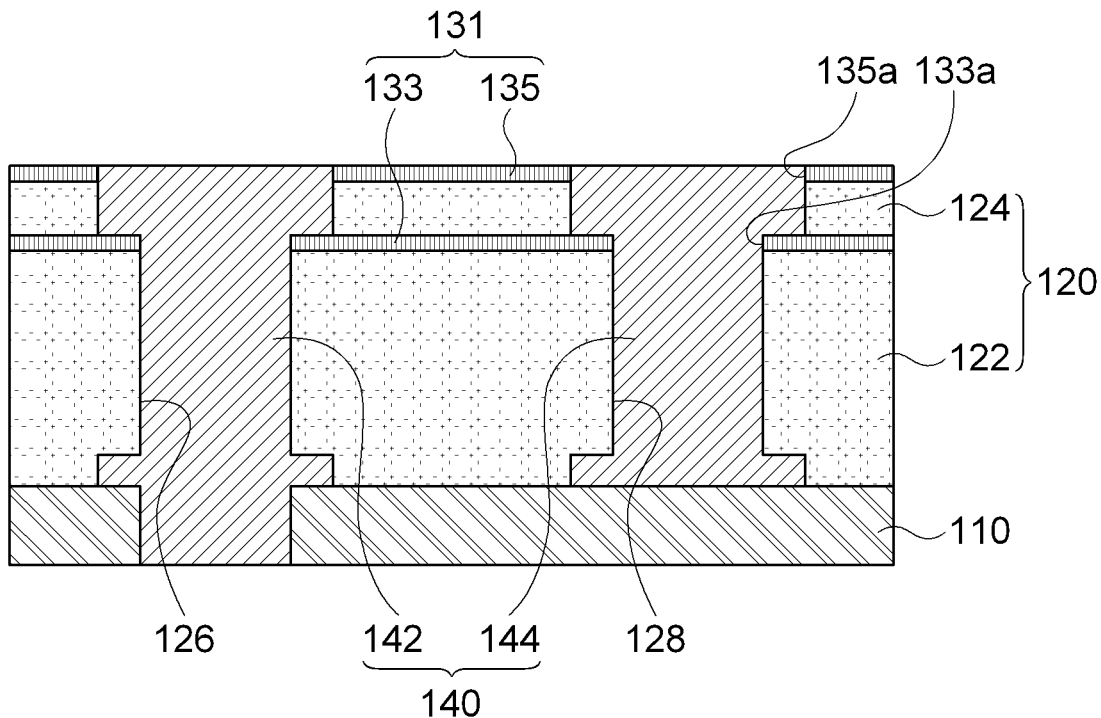

Referring to FIGS. 5 and 6c, a plating process is formed by using the interlayer insulating layer 120 as a plating resist (S230). Accordingly, a via structure 140 having a through hole 142 and a buried via 144, which vertically pass through the interlayer insulating layer 120, may be formed on the base substrate 110. At this time, upper ends of the through via 142 and the buried via 144 may be surrounded by the second etch stop pattern 135 of the etch stop pattern 131.

Meanwhile, the step of removing the second etch stop pattern 135 may be additionally performed to project the via structure upwardly from an upper surface of the interlayer insulating layer 120 as much as the thickness of the second etch stop pattern 135. In this case, the second etch stop pattern 135 may be removed from the interlayer insulating layer 120 to manufacture a circuit board only having the first etch stop pattern 133.

Hereinafter, a circuit board in accordance with another embodiment of the present invention will be described in detail. Here, descriptions overlapping with those of the circuit boards 100 and 101 and the methods for manufacturing the same described above will be omitted or simplified.

Figure 7:
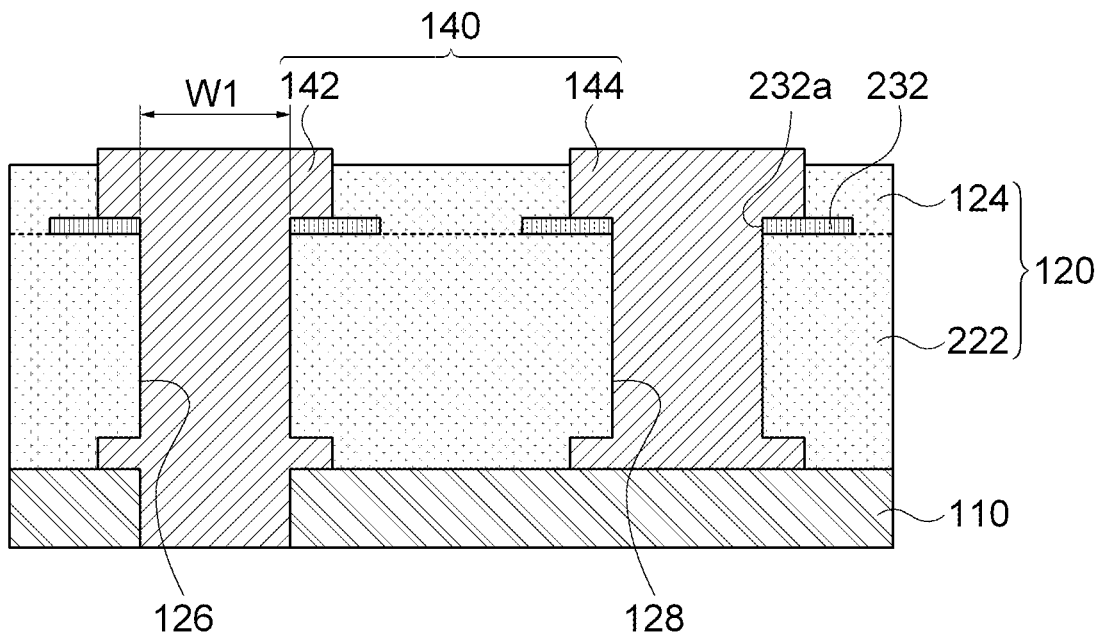
FIG. 7 is a view showing a circuit board in accordance with another embodiment of the present invention.

FIG. 7 is a view showing a circuit board in accordance with another embodiment of the present invention. Referring to FIG. 7, a circuit board 200 in accordance with another embodiment of the present invention may include a base substrate 110, a multilayered interlayer insulating layer 120 which covers the base substrate 110, a via structure 140 vertically passing through at least the interlayer insulating layer 120 of the base substrate 110 and the interlayer insulating layer 120, and a ring-shaped etch stop pattern 232 provided on the interlayer insulating layer 120. The via structure 140 may have a through via 142 and a buried via 144.

The ring-shaped etch stop pattern 232 may be disposed between a first insulating layer 122 and a second insulating layer 124 of the interlayer insulating layer 120 in the horizontal direction. An opening for defining a first opening width W1 may be formed in the ring-shaped etch stop pattern 232 in a process of forming first and second via holes 126 and 128. The etch stop pattern 232 may be formed of a material having a different etch selectivity from the interlayer insulating layer 120. As an example, the etch stop pattern 232 may be a conductive layer having a remarkably lower etch rate than the interlayer insulating layer 120 and may be formed of various types of metal materials.

Here, the ring-shaped etch stop pattern 232 may be provided in the shape of a ring surrounding the via structure 140 to prevent electrical connection between the through via 142 and the buried via 144. More specifically, the etch stop pattern 232 may surround a portion of the through via 142 adjacent to a boundary between the first and second insulating layers 122 and 124 with a predetermined width and may surround a portion of the buried via 144 adjacent to the boundary with a predetermined width. In this case, since a portion of the etch stop pattern 232, which surrounds the through via 142, and a portion of the etch stop pattern 232, which surrounds the buried via 144, are separated from each other, it is possible to prevent an electrical short between the through via 142 and the buried via 144.

As described above, the circuit board 200 in accordance with another embodiment of the present invention may include the base substrate 110, the interlayer insulating layer 120, the via structure 140, and the ring-shaped etch stop pattern 232 made of a metal material, wherein the ring-shaped etch stop pattern 232 may have a structure surrounding the individual vias 142 and 144 only with a predetermined with to prevent the electrical connection between the individual vias 142 and 144. In this case, compared to the etch stop pattern 130 described above with reference to FIGS. 1 to 4 having a structure in which the individual vias 142 and 144 are connected in one plate shape, the etch stop pattern 232 may be provided to surround each of the individual vias 142 and 144 in a ring shape. Accordingly, the circuit board in accordance with the present invention can form a via hole using an etch stop pattern with the remarkably improved etch selectivity to the interlayer insulating layer by forming the etch stop pattern, which is used to form a via structure, with a metal material.

Continuously, a method for manufacturing a circuit board in accordance with another embodiment of the present invention will be described. Here, descriptions overlapping with those of the circuit board 200 in accordance with another embodiment of the present invention described above will be omitted or simplified.

Figure 8:
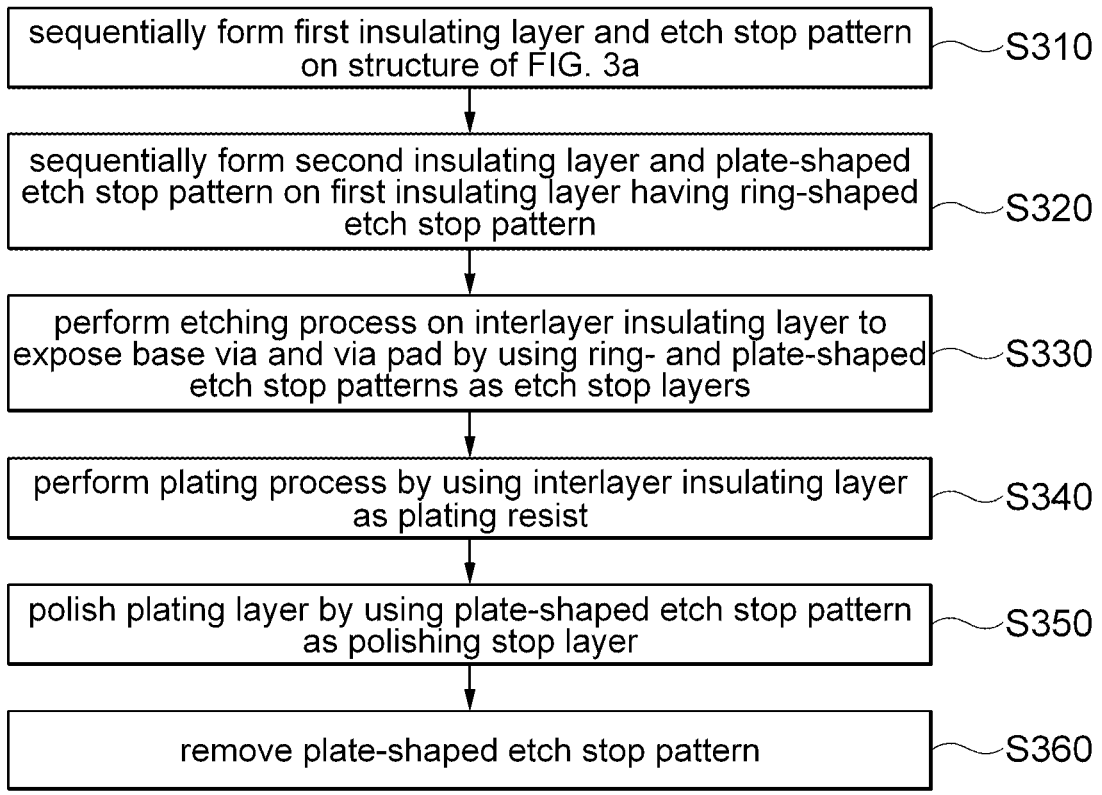
FIG. 8 is a flowchart showing a method for manufacturing a circuit board in accordance with another embodiment of the present invention.

FIG. 8 is a flowchart showing a method for manufacturing a circuit board in accordance with another embodiment of the present invention, and FIGS. 9a to 9d are views for explaining a process of manufacturing a circuit board in accordance with another embodiment of the present invention.

Figure 9A:
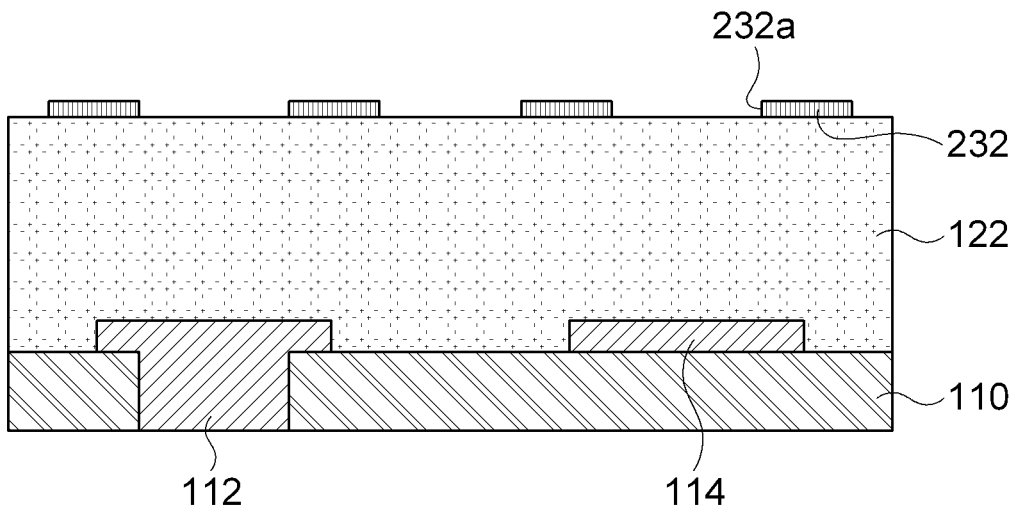
FIGS. 9a to 9d are views for explaining a process of manufacturing a circuit board in accordance with another embodiment of the present invention.

Referring to FIGS. 8 and 9a, a first insulating layer 122 and a ring-shaped etch stop pattern 232 are formed on the structure of FIG. 3a (S310). Accordingly, the first insulating layer 122 and the ring-shaped etch stop pattern 232 can be formed on a base substrate 210 having a base via 112 and a connection pad 114. At this time, a third opening 232a may be formed in regions of the ring-shaped etch stop pattern 232 opposite to the base via 112 and the connection pad 114.

Figure 9B:
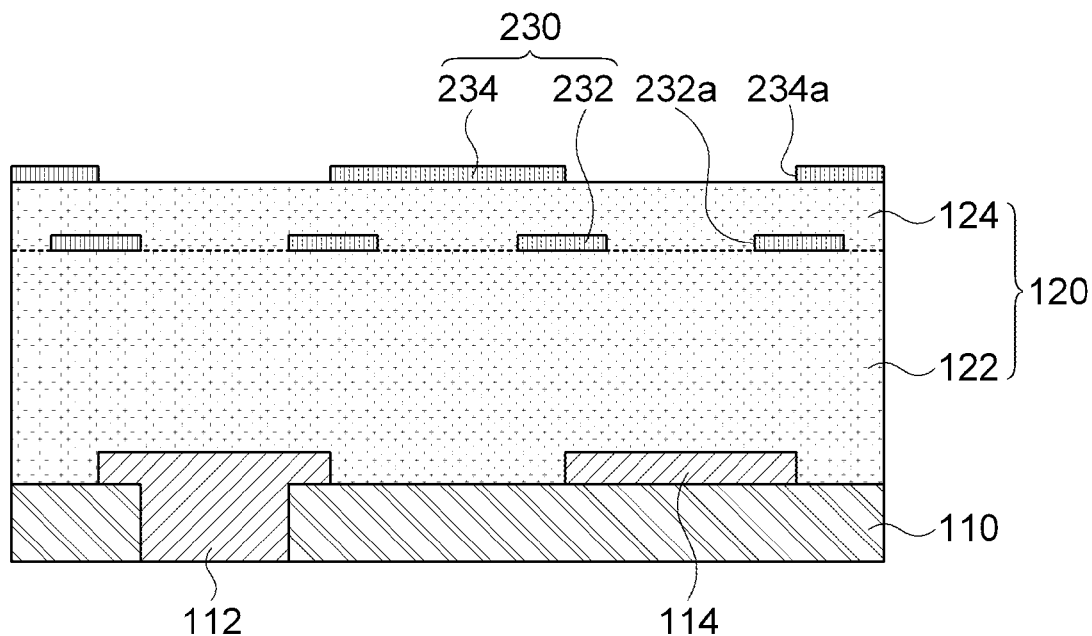

Referring to FIGS. 8 and 9b, a second insulating layer 124 and a plate-shaped etch stop pattern 234 are formed on the first insulating layer 122 having the etch stop pattern 232 thereon (S320). A fourth opening 234a, which is opposite to the third opening 232a and has a larger width than the third opening 232a, may be formed in the plate-shaped etch stop pattern 234. In addition, the plate-shaped etch stop pattern 234 may be provided in the shape of a porous plate having the fourth openings 234a so that a plurality of individual vias can be connected in one plate shape when the plate-shaped etch stop pattern 234 is seen from above.

Figure 9C:
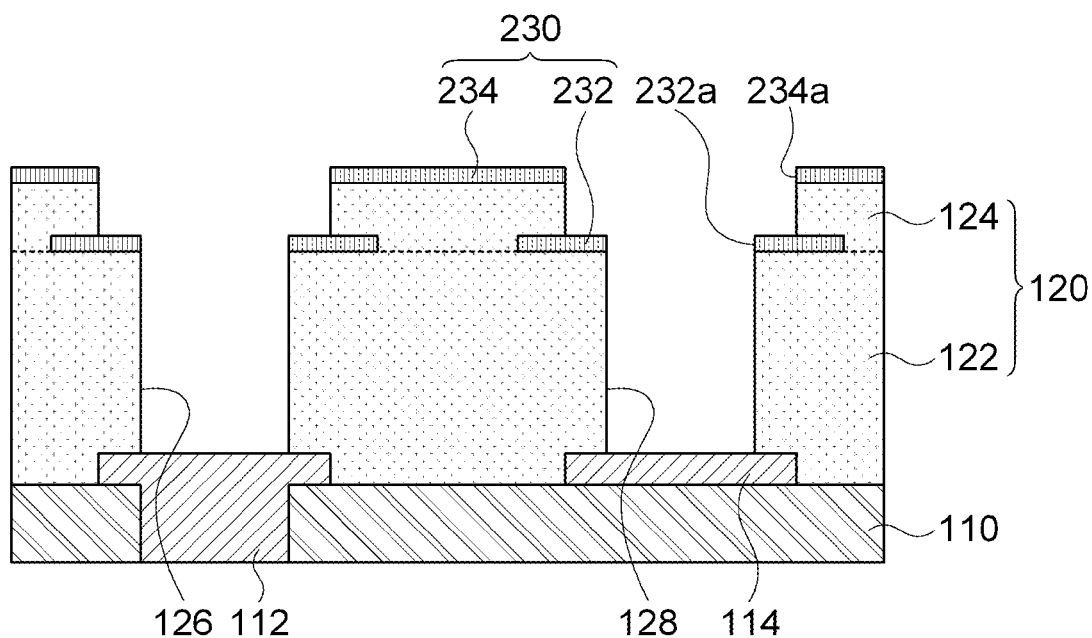

Referring to FIGS. 8 and 9c, an etching process is performed on the interlayer insulating layer 120 to expose the base via 112 and the connection pad 114 by using the etch stop pattern 230 as an etch stop layer (S330). The etching process may be an RIE process. Accordingly, a first through hole 126, which exposes the base via 112, and a second through hole 128, which exposes the connection pad 114, can be formed in the interlayer insulating layer 120.

Figure 9D:
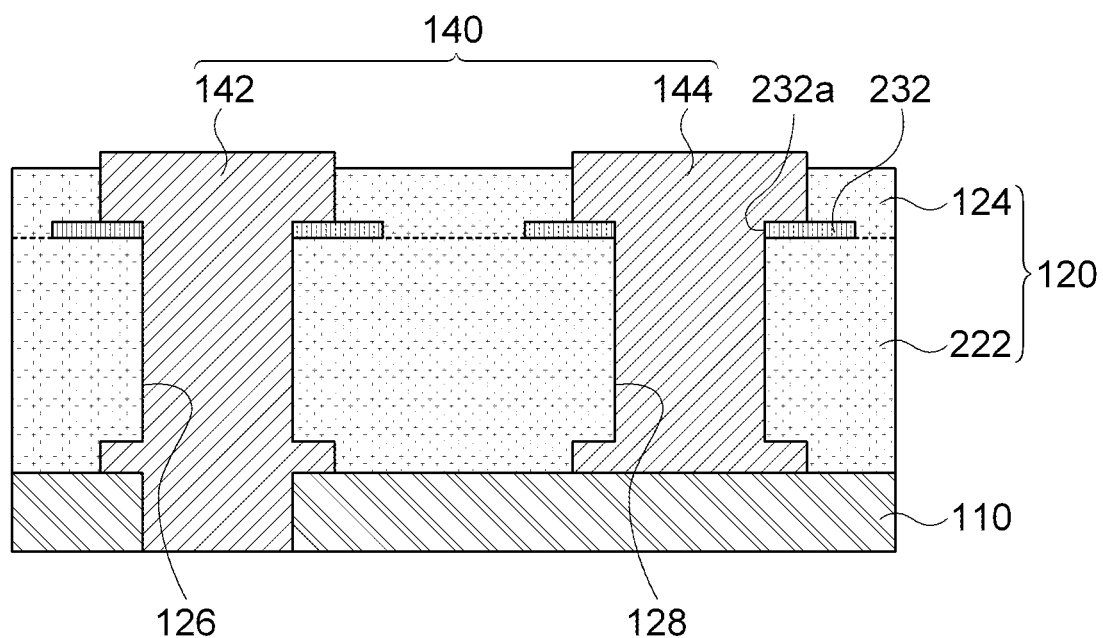

Referring to FIGS. 8 and 9d, a plating process is performed by using the interlayer insulating layer 120 as a plating resist (S340). Accordingly, a via structure 140 having a through via 142 and a buried via 144 can be formed by filling a plating layer in the first and second through holes 126 and 128.

And, the plating layer is polished by using the plated-shaped etch stop pattern 234 as a polishing stop layer (S350). Accordingly, the via structure 140 having the through hole 142 and the buried via 144 that vertically pass through the interlayer insulating layer 120 can be formed on the base substrate 110.

Meanwhile, the plate-shaped etch stop pattern 234 is removed (S360). When the plated-shaped etch stop pattern 234 of the etch stop pattern 230 is made of a material equal or similar to that of the ring-shaped etch stop pattern 232, an electrical short may occur in the additionally formed circuit structure due to the plate-shaped etch stop pattern 234. Accordingly, it is possible to prevent this electrical short by removing the plate-shaped etch stop pattern 234.

As described above, the method for manufacturing a circuit board in accordance with an embodiment of the present invention can form a via hole using an etch stop pattern having the remarkably improved etch selectivity to an interlayer insulating layer by forming the etch stop pattern, which is used to form a via structure, with a metal material, thereby improving efficiency of the process of forming the via hole.

Since the circuit board in accordance with the present invention has a structure in which a via structure vertically passing through an interlayer insulating layer having a relatively large thickness has a vertically perpendicular side surface, it is possible to implement a fine pitch of the via structure by reducing the interval between the via structures.

Since the circuit board in accordance with the present invention can form an etch stop pattern, which is used to form a via structure, with a metal material, it is possible to form a via hole by using the etch stop pattern with the remarkably improved etch selectivity to an interlayer insulating layer.

Since the method for manufacturing a printed circuit in accordance with an embodiment of the present invention forms a multilayered interlayer insulating layer having an etch stop pattern embedded therein and forms a via structure which passes through the interlayer insulating layer by performing an RIE process using the etch stop pattern as an etch stop layer on the interlayer insulating layer, it is possible to form a via structure having a vertically perpendicular side surface in the relatively thick interlayer insulating layer, thus forming a fine-pitch via structure. Particularly, the method for manufacturing a circuit board in accordance with an embodiment of the present invention can form a via structure having a vertically perpendicular side surface even when the thickness of the interlayer insulating layer is greater than 2 μm, compared to a conventional method that forms a via structure having an inclined side surface when the thickness of an interlayer insulating layer is greater than 2 μm.

The method for manufacturing a printed circuit in accordance with an embodiment of the present invention can form a via and a via pad at the same time by performing a plating process to form a via structure after forming a via hole having a larger upper width than a lower width in an interlayer insulating layer and using a plated portion formed within the upper width as the via pad of the via structure. In this case, it is possible to simplify processes and thus improve process efficiency compared to the case in which a via and a via pad are formed by separate processes.

The circuit board in accordance with the present invention can form a via hole using an etch stop pattern having the remarkably improved etch selectivity to an interlayer insulating layer by forming the etch stop pattern, which is used to form a via structure, with a metal material, thereby improving efficiency of the process of forming the via hole.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A circuit board comprising:
a base substrate;
an interlayer insulating layer covering the base substrate;
a via structure passing through at least the interlayer insulating layer of the base substrate and the interlayer insulating layer in the vertical direction; and
an etch stop pattern disposed on the interlayer insulating layer in the horizontal direction perpendicular to the vertical direction to surround the via structure and made of an insulating material,
the interlayer insulating layer comprising
a first insulating layer covering the base substrate to surround a lower portion of the via structure, and
a second insulating layer covering the first insulating layer to surround an upper portion of the via structure, and
the first insulating layer and the second insulating layer are made of different photosensitive insulating materials.

2. The circuit board according to claim 1, wherein the etch stop pattern has a lower etch rate than the interlayer insulating layer.

3. The circuit board according to claim 1, wherein the via structure comprises a through via passing through both of the base substrate and the interlayer insulating layer.

4. The circuit board according to claim 1, wherein the via structure comprises a buried via passing through only the interlayer insulating layer.

5. The circuit board according to claim 1, wherein the via structure comprises:
a via body passing through the interlayer insulating layer; and
a via pad connected to the via body on the interlayer insulating layer, wherein the via body and the via pad are integrally formed by a single plating process.

6. The circuit board according to claim 1, wherein the etch stop pattern is interposed between the first insulating layer and the second insulating layer.

7. The circuit board according to claim 1, wherein the etch stop pattern comprises:

a first etch stop pattern interposed between the first insulating layer and the second insulating layer; and
a second etch stop pattern disposed on the second insulating layer and having an upper surface coplanar with an upper surface of the via structure.

8. The circuit board according to claim 1, wherein
the etch stop pattern comprises a first etch stop pattern interposed between the first insulating layer and the second insulating layer, and
the via structure projects higher than an upper surface of the second insulating layer.

9. The circuit board according to claim 1, wherein the first insulating layer and the second insulating layer are made of the same insulating material.

10. The circuit board according to claim 1, wherein the interlayer insulating layer has a thickness of greater than 2 µm, and the via structure has a vertically perpendicular side surface.

11. A method for manufacturing a circuit board, comprising:
preparing a base substrate;
forming a first insulating layer on the base substrate;
forming an etch stop pattern on the first insulating layer with an insulating material;
forming a second insulating layer on the etch stop pattern, the forming the second insulating layer comprising forming a photosensitive layer having different photosensitive properties from the first insulating layer on the etch stop pattern;
performing an etching process for removing the second insulating layer and the first insulating layer by using the etch stop pattern as an etch stop layer to expose the base substrate; and
performing a plating process by using the second insulating layer as a plating resist.

12. The method for manufacturing a circuit board according to claim 11, wherein forming the etch stop pattern comprises coating a material having a lower etch rate than the first insulating layer and the second insulating layer on the first insulating layer.

13. The method for manufacturing a circuit board according to claim 11, wherein performing the etching process comprises performing a reactive ion etching (RIE) process.

14. The method for manufacturing a circuit board according to claim 11, wherein forming the second insulating layer comprises forming an insulating layer equal to the first insulating layer on the etch stop pattern.

15. The method for manufacturing a circuit board according to claim 11, further comprising, after the plating process, performing a polishing process by using the second insulating layer as a polishing stop layer.

16. A circuit board comprising:
a base substrate;
an interlayer insulating layer covering the base substrate;
a via structure passing through at least the interlayer insulating layer of the base substrate and the interlayer insulating layer in the vertical direction; and
an etch stop pattern disposed inside the interlayer insulating layer in the horizontal direction perpendicular to the vertical direction to have a ring shape surrounding a side surface of the via structure and made of a conductive material.

17. The circuit board according to claim 16, wherein the etch stop pattern has a lower etch rate than the interlayer insulating layer.

18. The circuit board according to claim 16, wherein the via structure comprises a through via passing through both of the base substrate and the interlayer insulating layer.

19. The circuit board according to claim 16, wherein the via structure comprises a buried via passing through only the interlayer insulating layer.

20. The circuit board according to claim 16, wherein the via structure comprises:
   a via body passing through the interlayer insulating layer; and
   a via pad connected to the via body on the interlayer insulating layer, wherein the via body and the via pad are integrally formed by a single plating process.

21. The circuit board according to claim 16, wherein the interlayer insulating layer comprises:
   a first insulating layer covering the base substrate to surround a lower portion of the via structure; and
   a second insulating layer covering the first insulating layer to surround an upper portion of the via structure, and
   the etch stop pattern is interposed between the first insulating layer and the second insulating layer.

22. The circuit board according to claim 16, wherein the interlayer insulating layer comprises:
   a first insulating layer covering the base substrate to surround a lower portion of the via structure; and
   a second insulating layer covering the first insulating layer to surround an upper portion of the via structure,
   the etch stop pattern is interposed between the first insulating layer and the second insulating layer, and
   the via structure projects higher than an upper surface of the second insulating layer.

23. The circuit board according to claim 16, wherein the interlayer insulating layer comprises:
   a first insulating layer covering the base substrate to surround a lower portion of the via structure; and
   a second insulating layer covering the first insulating layer to surround an upper portion of the via structure, and
   the first insulating layer and the second insulating layer are made of different photosensitive insulating materials.

24. The circuit board according to claim 16, wherein the interlayer insulating layer comprises:
   a first insulating layer covering the base substrate to surround a lower portion of the via structure; and
   a second insulating layer covering the first insulating layer to surround an upper portion of the via structure, and
   the first insulating layer and the second insulating layer are made of the same insulating material.

25. The circuit board according to claim 16, wherein the interlayer insulating layer has a thickness of greater than 2 μm, and the via structure has a vertically perpendicular side surface.

26. A method for manufacturing a circuit board, comprising:
   preparing a base substrate;
   forming a first insulating layer on the base substrate;
   forming a ring-shaped etch stop pattern on the first insulating layer with a conductive material;
   forming a second insulating layer on the etch stop pattern;
   forming a porous plate-shaped etch stop pattern on the second insulating layer with a conductive material;
   performing an etching process for removing the second insulating layer and the first insulating layer by using the ring- and plate-shaped etch stop patterns as etch stop layers to expose the base substrate;
   performing a plating process by using the second insulating layer as a plating resist; and
   removing the plate-shaped etch stop pattern.

27. The method for manufacturing a circuit board according to claim 26, wherein forming the etch stop pattern comprises coating a material having a lower etch rate than the first insulating layer and the second insulating layer on the first insulating layer.

28. The method for manufacturing a circuit board according to claim 26, wherein performing the etching process comprises performing a reactive ion etching (RIE) process.

29. The method for manufacturing a circuit board according to claim 26, wherein forming the second insulating layer comprises forming a photosensitive layer different from the first insulating layer on the ring-shaped etch stop pattern.

30. The method for manufacturing a circuit board according to claim 26, wherein forming the second insulating layer comprises forming an insulating layer equal to the first insulating layer on the ring-shaped etch stop pattern.

31. The method for manufacturing a circuit board according to claim 26, further comprising, after the plating process, performing a polishing process by using the plate-shaped etch stop pattern as a polishing stop layer.

* * * * *